US012693452B2

(12) United States Patent
Yang et al.

(10) Patent No.: US 12,693,452 B2
(45) Date of Patent: Jul. 28, 2026

(54) OPTICAL SYSTEM AND METHODS INCLUDING MICROLENSES AND LIGHT-BLOCKING LAYER

(71) Applicant: 3M INNOVATIVE PROPERTIES COMPANY, St. Paul, MN (US)

(72) Inventors: Zhaohui Yang, North Oaks, MN (US); Matthew S. Stay, Bloomington, MN (US); Matthew R.D. Smith, Woodbury, MN (US); Tri D. Pham, Woodbury, MN (US); Adam T. Ringberg, St. Paul, MN (US); Serena L. Schleusner, Roberts, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 1037 days.

(21) Appl. No.: 17/767,977

(22) PCT Filed: Oct. 15, 2020

(86) PCT No.: PCT/IB2020/059730
§ 371 (c)(1),
(2) Date: Apr. 11, 2022

(87) PCT Pub. No.: WO2021/074861
PCT Pub. Date: Apr. 22, 2021

(65) Prior Publication Data
US 2024/0094443 A1    Mar. 21, 2024

Related U.S. Application Data

(60) Provisional application No. 62/916,441, filed on Oct. 17, 2019.

(51) Int. Cl.
*G02B 3/00* (2006.01)
*G02B 5/00* (2006.01)
(Continued)

(52) U.S. Cl.
CPC ........... *G02B 3/0056* (2013.01); *G02B 5/003* (2013.01); *G06V 10/147* (2022.01);
(Continued)

(58) Field of Classification Search
CPC .. G02B 3/0006; G02B 3/0037; G02B 3/0043; G02B 3/005; G02B 3/0056;
(Continued)

(56) References Cited

U.S. PATENT DOCUMENTS 6,384,970 B1    5/2002   Abe et al.
6,469,830 B1    10/2002  Dubin et al.
(Continued)

FOREIGN PATENT DOCUMENTS

CN    109313287 A    7/2021
EP    2770727 A2     8/2014

OTHER PUBLICATIONS

International Search report for PCT International Application No. PCT/IB2020/059730 mailed on Mar. 15, 2021, 6 pages.

*Primary Examiner* — Nicholas R. Pasko
(74) *Attorney, Agent, or Firm* — Christopher P. Tebow

(57)    ABSTRACT

An optical system is disclosed and includes an optical sensor configured to receive light and form an image. The optical system further includes a microlens film including a structured first major surface opposite a second major surface, the structured first major surface includes a regular array of spaced apart microlenses arranged across a width and a length of the microlens film and each microlens has an effective imaging area and configured to form an image onto the optical sensor. A light absorbing layer is disposed on the array of spaced apart microlenses and reduces the effective imaging area of each microlens by at least 10%. A display panel, the optical sensor, the microlens film and the display
(Continued)

plane are substantially co-extensive with each other along the width and length of the microlens film.

4 Claims, 5 Drawing Sheets

(51) Int. Cl.

| | |
|---|---|
| *G06V 10/147* | (2022.01) |
| *G06V 40/13* | (2022.01) |
| *H10K 59/65* | (2023.01) |
| *H10K 59/80* | (2023.01) |

(52) U.S. Cl.
CPC ......... *G06V 40/1318* (2022.01); *H10K 59/65* (2023.02); *H10K 59/879* (2023.02)

(58) Field of Classification Search
CPC .... G02B 3/0075; G02B 5/003; G06V 10/147; G06V 40/13; G06V 40/1324; H10H 20/65; H10H 20/855; H10K 59/879
See application file for complete search history.

(56) References Cited

U.S. PATENT DOCUMENTS

| | | | | |
|---|---|---|---|---|
| 6,567,215 | B2 | 5/2003 | Ballen et al. | |
| 2011/0025899 | A1 | 2/2011 | Schmaelzle | |
| 2016/0037022 | A1 | 2/2016 | Matsuzaki | |
| 2016/0238748 | A1 | 8/2016 | Lee et al. | |
| 2018/0076246 | A1 | 3/2018 | Chen et al. | |
| 2018/0267362 | A1* | 9/2018 | Gahagan | G02F 1/133611 |
| 2018/0336389 | A1* | 11/2018 | Wu | B32B 37/14 |
| 2019/0206925 | A1* | 7/2019 | Yamamoto | H10F 39/024 |
| 2019/0228204 | A1* | 7/2019 | Park | G06V 40/1335 |
| 2019/0229136 | A1* | 7/2019 | Hayashi | H10F 39/8057 |
| 2019/0251318 | A1* | 8/2019 | Jung | G06V 40/1306 |
| 2020/0380237 | A1* | 12/2020 | Nilsson | G06V 10/147 |
| 2021/0151511 | A1* | 5/2021 | Kim | H10K 59/879 |
| 2021/0286963 | A1* | 9/2021 | Gao | G06V 40/1318 |
| 2022/0043998 | A1* | 2/2022 | Nilsson | G06V 40/1324 |
| 2022/0343670 | A1* | 10/2022 | Husth | G06V 40/1324 |

* cited by examiner

OPTICAL SYSTEM AND METHODS INCLUDING MICROLENSES AND LIGHT-BLOCKING LAYER

CROSS REFERENCE TO RELATED APPLICATIONS

This application is a national stage filing under 35 U.S.C. 371 of PCT/IB2020/059730, filed Oct. 15, 2020, which claims the benefit of U.S. Application No. 62/916,441, filed Oct. 17, 2019, the disclosure of which is incorporated by reference in its/their entirety herein.

BACKGROUND

Optical systems can include a plurality of microlenses to focus and transmit light. Various arrangements of optical elements can facilitate the selective transmission of light through the microlenses based upon certain angular ranges.

SUMMARY

In some aspects, an optical system is disclosed. The optical system can include an optical sensor configured to receive light and form an image and a microlens film. The microlens film can include a structured first major surface opposite a second major surface, the structured first major surface can include a regular array of spaced apart microlenses arranged across a width and a length of the microlens film, each microlens can have an effective imaging area and be configured to form an image onto the optical sensor. A light absorbing layer can be disposed on the array of spaced apart microlenses and reduce the effective imaging area of each microlens by at least 10%. A display panel, the optical sensor, the microlens film and the display plane can be substantially co-extensive with each other along the width and length of the microlens film, such that when an object having a first spatial frequency of about 4 line pairs per mm is placed about 1.5 mm from the microlens film, each microlens forms an image of the object on the optical sensor, the image having a modulation transfer function (MTF) of greater than about 0.2 at the first spatial frequency.

In some aspects, an optical film is disclosed. The optical film can include a microlens film including a structured first major surface opposite a second major surface, the structured first major surface can include a regular array of spaced apart microlenses arranged at a pitch P across a width and a length of the microlens film. Each microlens can be configured to have a half field of view θ. A light absorbing layer can be disposed on the structured first major surface and cover regions between the microlenses and at least portions of the microlenses so as to reduce an effective imaging area of the microlenses by at least 10%. The microlens film can have an average thickness D and an effective index n along the thickness direction thereof, such that P, θ and n are related by the equation:

$$\sin\left(a\tan\left(\frac{P}{2D}\right)\right) \times n \geq \sin(\theta).$$

In some aspects, an optical construction is disclosed. The optical construction can include a structured optical film including a structured first major surface having a first surface energy and a regular array of spaced apart structures arranged across a width and a length of the structured optical film, and each structure can have a maximum height H1. An intermediate optical layer can be disposed on, and substantially co-extensive with, the structured first major surface and include a structured second major surface opposite the structured first major surface. The structured second major surface can have a second surface energy less than the first surface energy by at least 20%, and the intermediate optical layer can have a maximum thickness H2, where H2≤0.1H1. A light absorbing layer can be disposed on, and substantially co-extensive with, the structured second major surface and cover regions between the structures and at least portions of the intermediate optical layer corresponding to the structures, so that an optical transmission of the optical construction in regions between the structures is less than an optical transmission of the optical construction in regions corresponding to the structures by at least a factor of 10.

The systems, structures and features disclosed herein can improve a signal-to-noise ratio when detecting images, such as a fingerprint, via the optical sensor from behind a display. Other benefits and uses are also foreseen.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

It may be desirable to use an optical device to transmit light to an optical sensor. To prevent certain angled light rays from passing through an optical layer from a reflection source, various structures, materials and geometries can be employed that also allow the passage of certain other light rays. Such a system can, for example, improve a signal-to-noise ratio of an optical sensor disposed within an electronic device.

Figure 1:
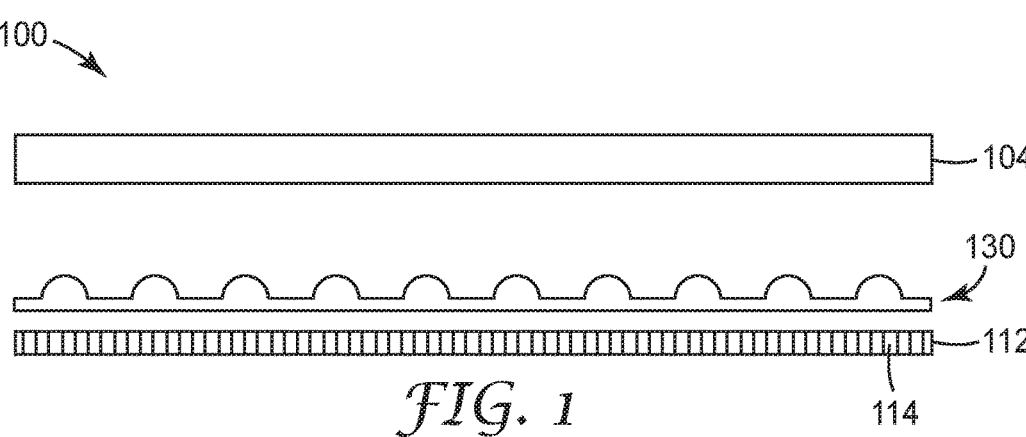
FIG. 1 is a schematic side elevation view of an optical system, according to exemplary embodiments of the present disclosure.

FIG. 1 is an exemplary side elevation view of an exemplary optical system 100. The optical system 100 can include a display 104 (or a display panel) and an optical sensor 112. In some embodiments, the display 104 can include an emissive display, such as an Organic Light-Emitting Diode (OLED) or a micro-LED (Light-Emitting Diode), or a transmissive display such as a Liquid Crystal Display (LCD).

The optical sensor 112 can be divided into a plurality of light-gathering photosensitive picture elements, or pixels 114. The optical sensor 112 can include a charge-coupled device, a complementary-metal-oxide semiconductor or can employ any other light-sensing sensor technology or a combination of light-sensing technologies. Additionally, the optical sensor 112 can include one or more photosensors, organic photosensors, photodiodes and/or organic photodiodes.

In some embodiments, the optical system 100 includes an optical layer 130. The optical layer 130 can be disposed substantially between the optical sensor 112 and the display 104. The optical layer 130 can include a microlens film 140 defining a structured first major surface 144 and a second major surface 148. The structured first major surface 144 and second major surface 148 can be disposed on substantially opposite sides of the microlens film 140. A plurality of microlenses 142 can be formed on the microlens film 140, and in some embodiments, can be formed on the structured first major surface 144.

The optical sensor 112, microlens film 140 and/or the optical layer 130 can be flexible. Such a flexible optical sensor 112, microlens film 140 and/or optical layer 130 can have properties of being bendable without cracking. Such a flexible optical sensor 112, microlens film 140 and/or optical layer 130 can also be capable of being formed into a roll. In some embodiments, the flexible optical sensor 112, microlens film 140 and/or optical layer 130 can be bent around a roll core with a radius of curvature of 7.6 centimeters (cm) (3 inches), 6.4 cm (2.5 inches), 5 cm (2 inches), 3.8 cm (1.5 inches), 2.5 cm (1 inch), 1.9 cm (¾ inch), 1.3 cm (½ inch) or 0.635 cm (¼ inch).

The microlens film 140 and microlenses 142 can be formed from a common material. This material can be a polymeric material having certain thermal or rheological properties. For example, the material may have a sufficiently high glass transition temperature to keep its form or rigidity during processing. In some embodiments, the material may be microreplicated through a continuous cast and cure microreplication process. Such a material may be curable by the application of radiation (such as heat or ultraviolet light). In some embodiments, the microlens film 140 and microlenses 142 can include polyethylene terephthalate. In some embodiments, the microlenses 142 can be formed, possibly by continuously casting and curing, on a substrate which could include polycarbonate. In some embodiments, the microlens film 140 can be formed using a light-curable material on polyethylene terephthalate and/or polycarbonate.

Figure 2:
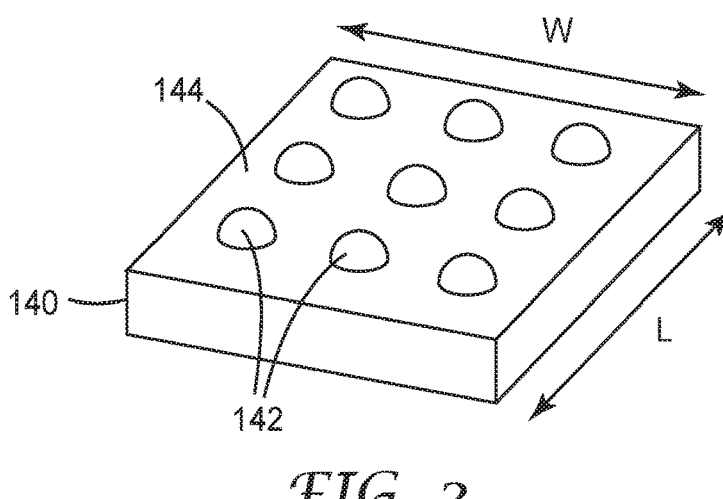
FIG. 2 is a schematic perspective view of an exemplary microlens film, according to exemplary embodiments of the present disclosure.

FIG. 2 illustrates an exemplary microlens film 140. A microlens film width W and a microlens film length L are also shown, along with the microlenses 142 and the structured first major surface.

Figure 3:
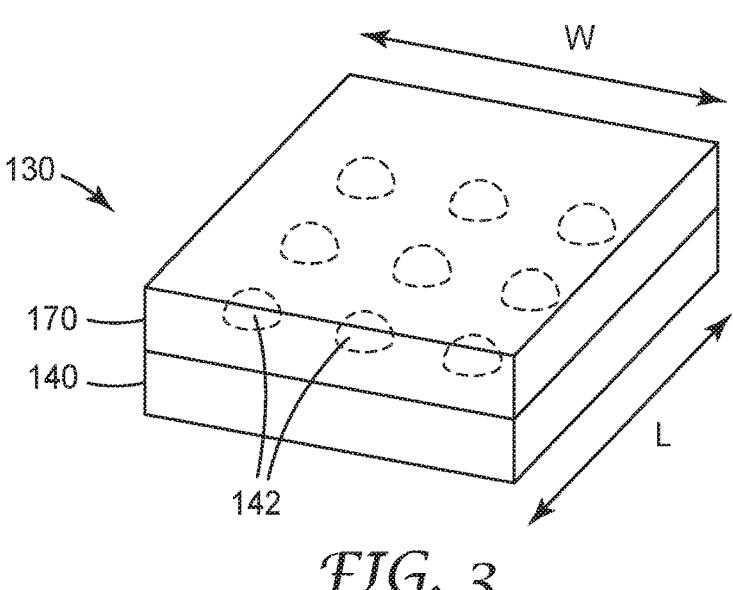
FIG. 3 is a schematic perspective view of an exemplary microlens film and a light absorbing layer, according to exemplary embodiments of the present disclosure.

FIG. 3 illustrates an exemplary microlens film 140 and further shows a light absorbing layer 170. The light absorbing layer 170 can be substantially co-extensive with the microlens film 140. In some embodiments, the light absorbing layer 170 is adjacent, joined to, in contact with and/or proximate the microlens film 140. In some embodiments, a thickness of the light absorbing layer 170 on one of the microlenses 142 as measured along an axis perpendicular to the second major surface 148 is greater than a thickness of the light absorbing layer 170 on an area of the microlens film 140 between microlenses 142 as measured along an axis perpendicular to the second major surface 148. In some embodiments, the light absorbing layer 170 is adjacent, joined to, in contact with and/or proximate the structured first major surface 144.

Figure 4:
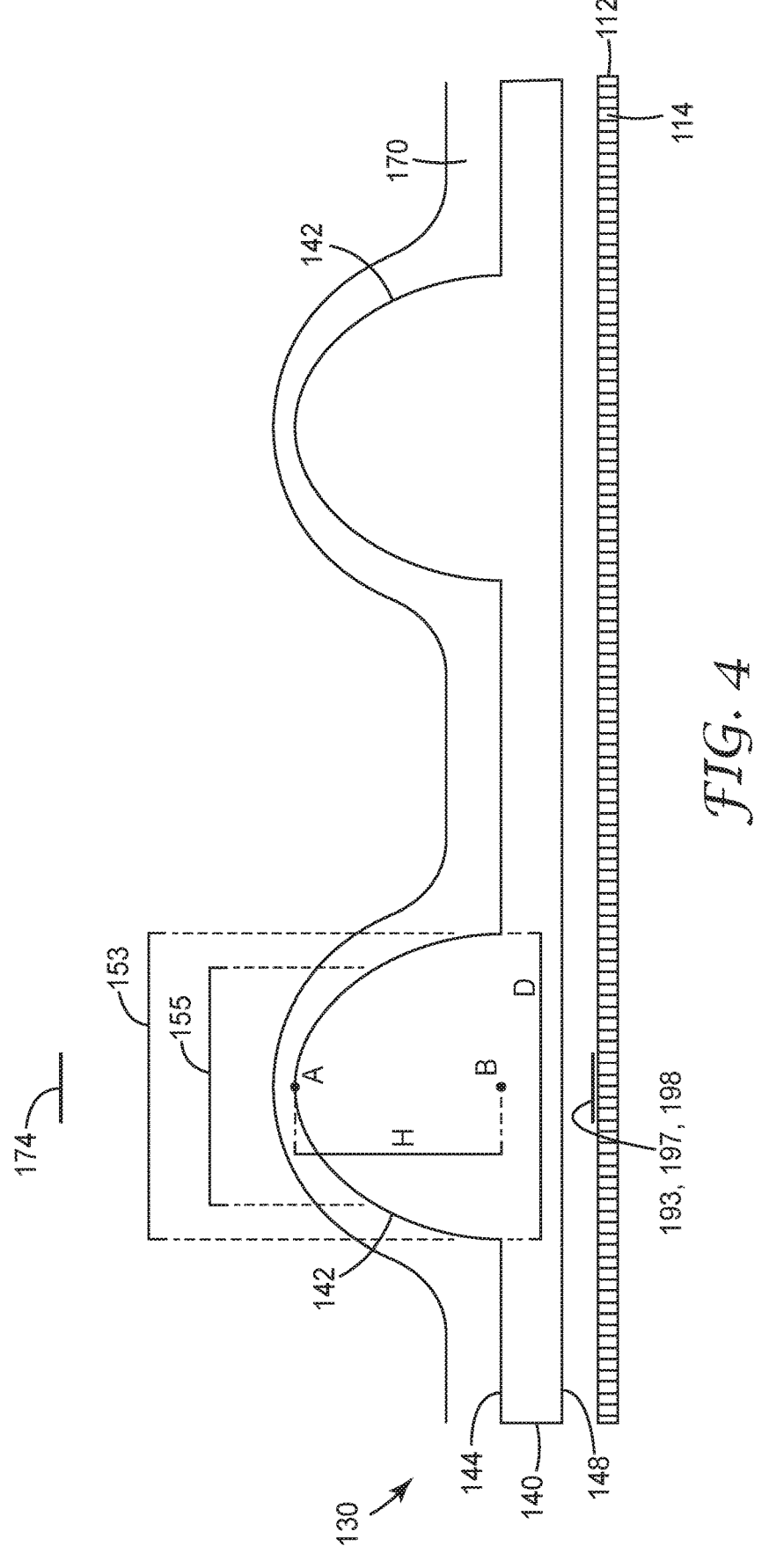
FIG. 4 is a schematic side elevation view of an optical layer, according to exemplary embodiments of the present disclosure.

FIG. 4 illustrates an exemplary embodiment of the optical layer 130. In some embodiments, the light absorbing layer 170 can include, or be formed from, a mixture of a binder, a light blocking material and a solvent. Upon sufficient evaporation of the solvent, the light absorbing layer 170 can be formed, continuously or non-continuously, over the microlenses 142 and structured first major surface 144. The light blocking material can include a dye or a pigment. In some embodiments, the light blocking material includes Orasol™ X45 black die (BASF).

The binder can include one or more of solvent-soluble nitrocellulose, ester-soluble nitrocellulose, cellulose acetate butyrate, cellulose acetate propionate, ethyl cellulose, maleic resins, ketone resins, shellac, alcohol-soluable polyamide resins, urea and melamine/formaldehyde resins, polyvinyl chloride copolymers, polyvinyl acetal resins, polyacrylic resins, epoxy resins, polyurethane resins, polyester resins, alkyd resins and polyvinyl butyral (such as PVB 30H, or any PVB in the Mowital grouping from Kuraray).

The solvent can include one or more of methyl ethyl ketone (MEK), acetone, methanol, ethanol, isopropyl alcohol, ethyl acetate, methyl isobutyl ketone and 1-methoxy-2-propanol. In some embodiments, the light absorbing layer 170 includes 6.8% by weight Orasol™ X45 black die (BASF), 8.2% by weight Mowital™ polyvinyl butyral (PVB 30H) and 85% by weight methyl ethyl ketone (MEK). In some embodiments, the polymer binder can be polymerized after coating a drying, such as if the dye were mixed with a UV-curable acrylate monomer and photoinitiator.

As exemplarily illustrated in FIG. 4, at least one microlens 142 defines a microlens diameter D and a microlens height H. While D can be used to indicate a diameter across a circular, or substantially circular, microlens 142, it is to be understood that D can be used to indicate a distance across a microlens 142 having any shape, a distance across a microlens 142 as measured along the shortest distance between microlens film 140 portions on opposed sides of the microlens 142 and/or an average of all possible distances across the microlens 142. The microlens height H can be used to indicate a height from a base B of the microlens 142 to an apex A of the microlens 142. Base B can be defined as a spatial point equidistant from opposed microlens 142 edges adjacent microlens film 140 portions on opposed sides of the microlens 142. The microlenses 142 can each have substantially the same shape (for example, spherical or aspherical), diameter D, height H, size and/or aspect ratio (ratio of height H to diameter D).

In some embodiments, a microlens height H of one or more microlenses 142 is greater than a diameter D of one or more microlenses 142. In some embodiments, one or more microlenses 142 has a microlens diameter D of about 10%, 20%, 30%, 40%, 50%, 60%, 70%, 80% or 90% of a microlens height H of one or more microlenses 142. In some embodiments, a microlens height H of one or more microlenses 142 is less than a microlens diameter D of one or more microlenses 142. In some embodiments, one or more microlenses 142 has a microlens height H of about 10%, 20%, 30%, 40%, 50%, 60%, 70%, 80% or 90% of a diameter D of one or more microlenses 142. In some embodiments, a microlens height H of one or more microlenses 142 is about equal to a diameter D of one or more microlenses 142.

In various embodiments, the microlens height H can be about 1, 2, 3, 4, 5, 6, 7, 8, 9, 10, 15, 20, 25, 30, 35, 40, 45, 50, 55, 60, 65, 70, 75, 80, 85, 90, 95, 100, 150, 200 or 250 micrometers, while the microlens diameter D can be about 50, 60, 70, 80, 90, 100, 125, 150, 175, 200, 210, 225, 250, 275, 300, 350, 400, 450 or 500 micrometers. Further, in some embodiments, the microlenses 142 can be spaced at a pitch of about 700 micrometers on the microlens film 140.

Figure 5:
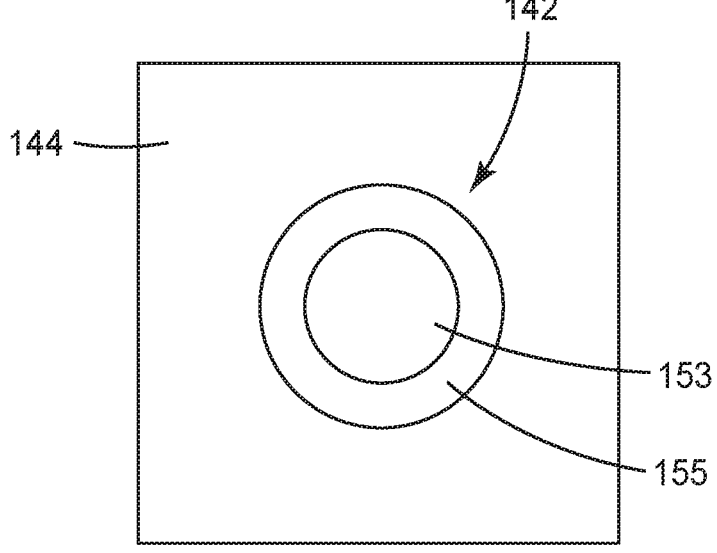
FIG. 5 is a schematic top view of an optical layer, in particular illustrating an effective imaging area and a microlens surface area, according to exemplary embodiments of the present disclosure.

In some embodiments, an effective imaging area 153 can be defined as a portion of the microlens 142 through which a certain percentage of incident light passes, as is illustrated in FIG. 5. In some embodiments, the effective imaging area 153 can be substantially the surface area 155 of the microlens 142. In some embodiments, the effective imaging area 153 can be smaller than the surface area 155 of the microlens 142. In some embodiments, the effective imaging area 153 can be reduced by the light absorbing layer 170, which can prevent light from passing through some portions of the microlens 142 and/or microlens surface area 155.

In some embodiments, the effective imaging area 153 defines a portion of the microlens 142 through which at least about 5%, 10%, 15%, 20%, 25%, 30%, 35%, 40%, 45%, 50%, 55%, 60%, 65%, 70%, 75%, 80%, 85%, 90% or 95% of incident light passes. In some embodiments, the effective imaging area 153 is reduced in size by the light absorbing layer 170 by about 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95%. In some embodiments, the effective imaging area 153 is reduced in size by the light absorbing layer 170 by at least about 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95%.

In some embodiments, the display 104, the optical sensor 112 and/or the microlens film 140 are substantially co-extensive with one another along the length L and width W of the microlens film 140, which can indicate the display 104, optical sensor 112 and/or the microlens film 140 are adjacent, in contact with, proximate and/or formed on one another.

As is known in the art, a modulation transfer function (MTF) can be a useful quantity to characterize resolution. The MTF can be determined by displaying an image of a line chart at a given spatial frequency and determining the maximum and minimum intensities in the displayed image. The MTF is given by the ratio of the difference in the maximum and minimum intensities divided by the sum of the maximum and minimum intensities. In the present disclosure, when an object 174 having a spatial frequency of about 4 line pairs per millimeter is placed about 1.5 mm from the microlens film 140, light absorbing layer 170 or optical layer 130, an image 193 formed by each microlens 142 on the optical sensor 112 has an MTF of greater than about 0.05, 0.1, 0.15, 0.2, 0.25, 0.3, 0.35, 0.4, 0.45 or 0.5 at the spatial frequency, in various embodiments.

In some embodiments, all but a first one of the microlenses 142 are covered such that only the first microlens 142 forms an image of the object 174 on the optical sensor 112. In such a case, the MTF of the image 197 formed by the first microlens 142 on the optical sensor 112 increases by less than about 5%, 10%, 15%, 20% or 25%. In some embodiments, the microlens film 140 and microlenses 142 can include polyethylene terephthalate (and further can be formed from a UV-curable polymer composition on a PET film).

Angular frequency can be used to measure a resolution of an imaging system independent of imaging distance and object distance. Angular frequency can be defined as (number of cycles)/(angular range of the number of cycles when an object is imaged by the microlens). In some embodiments, when the object 174 has a first angular frequency of about 6 cycles per radian, and is placed in front of the microlens film 140, each microlens 142 forms an image 198 of the object on the optical sensor 112 having a modulation transfer function (MTF) of greater than about 0.2 at the first angular frequency. In various embodiments, the image 198 of the object on the optical sensor 112 can have a modulation transfer function (MTF) of greater than about 0.05, 0.1, 0.15, 0.2, 0.25, 0.3, 0.35, 0.4, 0.45 or 0.5 at the first angular frequency.

Figure 6:
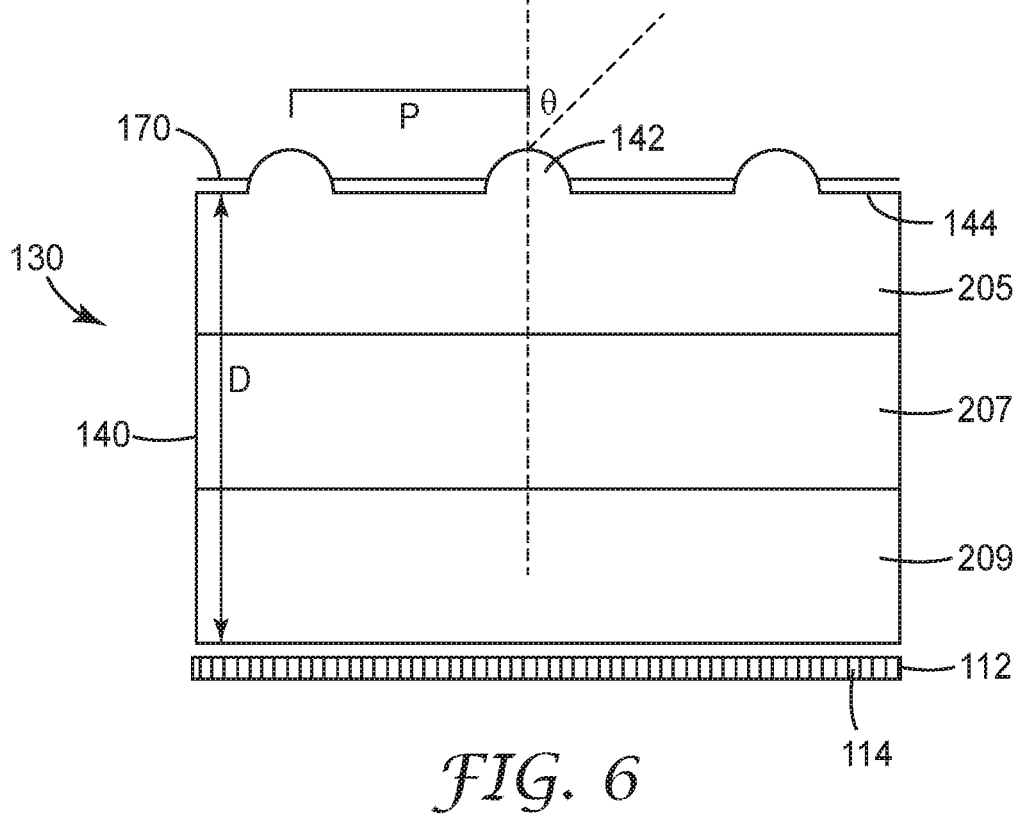
FIG. 6 is a schematic side view of an optical layer, according to exemplary embodiments of the present disclosure.

In some embodiments, as can be seen in FIG. 6, the microlens film 140 can define the structured first major surface 144 and the second major surface 148. The structured first major surface 144 and second major surface 148 can be disposed on substantially opposite sides of the microlens film 140. The structured first major surface 144 can include a regular array of spaced apart microlenses 142 arranged at a pitch P across the width W and length L of the microlens film 140. In some embodiments, the regular array of spaced apart microlenses 142 includes a hexagonal, or hex-packed, array where each microlens 142 is substantially equidistant to the nearest six other microlenses 142 or a square grid-shaped array where each microlens 142 is substantially equidistant to the nearest four other microlenses 142 (as is shown in FIGS. 2 and 3). Other arrangements are within the scope of this disclosure, such as a triangular array, rectangular array, pentagonal array, heptagonal array and octagonal array.

In some embodiments, each microlens 142 is configured to have a half field of view θ. The light absorbing layer 170 can be disposed on at least portions of the structured first major surface 144, and can further be disposed at least partially covering regions of the structured first major surface 144 between microlenses 142. Further, the light absorbing layer 170 can cover at least portions of the microlenses 142 to reduce the effective imaging area 153 of the microlenses 142 by at least 10%, as described above.

As shown in FIG. 6, the microlens film 140 can have an average thickness D and an effective index n along a thickness direction thereof (indicated by the arrow showing the length D). The microlens film 140 can include a microlens layer 205, a substrate 209 and an index matching layer 207 disposed between the microlens layer 205 and the substrate 209. In some embodiments, the substrate 209 includes a polycarbonate.

In some embodiments, P, n, D and θ are related by the equation:

$$\sin\left(atan\left(\frac{P}{2D}\right)\right) \times n \geq \sin(\theta)$$

In various embodiments, θ can be at least 5, 10, 15, 20, 25, 30, 35, 40, 45, 50, 55, 60, 65 or 70 degrees. As described above, the light absorbing layer 170 can be disposed as a continuous layer, or a substantially continuous layer, over, on, adjacent and/or proximate the microlenses 142 and/or the structured first major surface 144.

Figure 7:
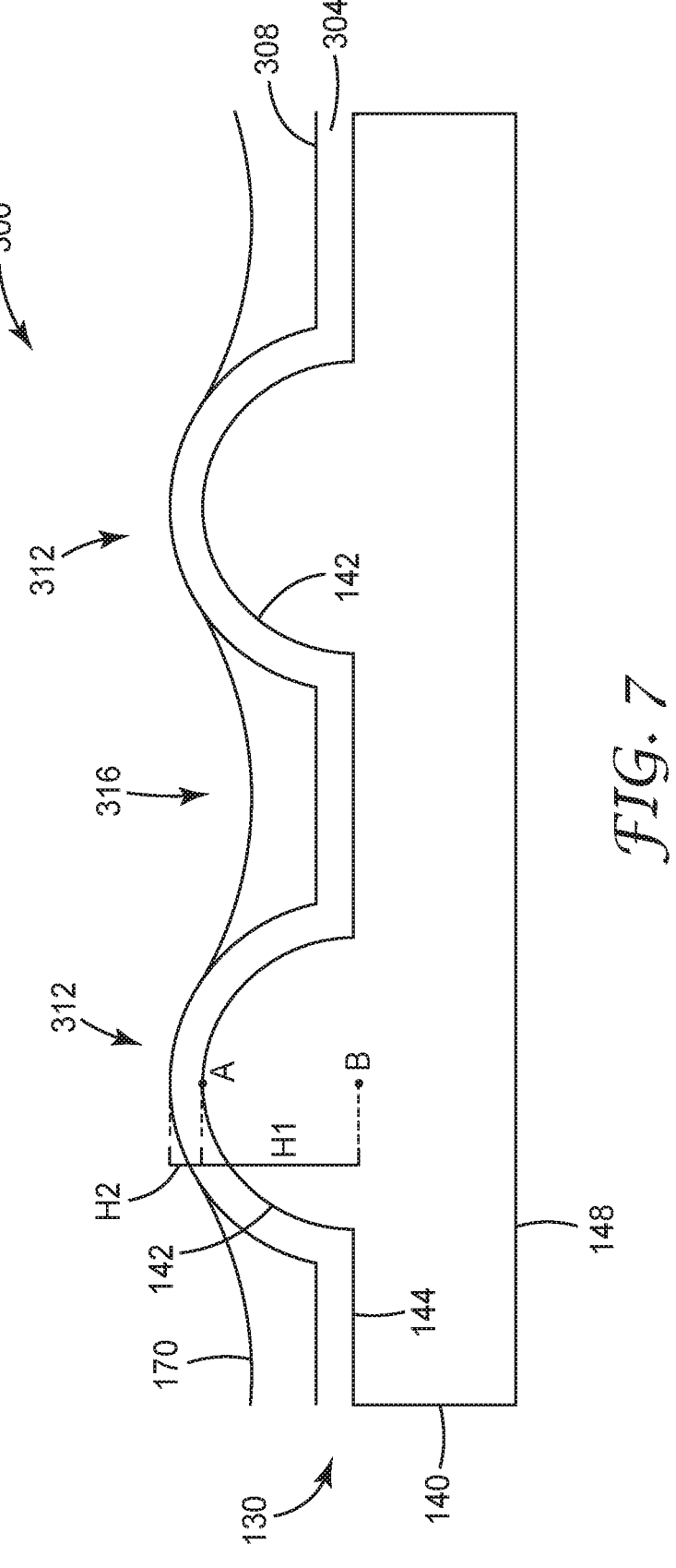
FIG. 7 is a schematic side view of an optical layer, according to exemplary embodiments of the present disclosure.

In some embodiments, an optical construction 300 is disclosed. The optical construction 300, as best shown in FIG. 7, includes the microlens film 140. The microlens film 140 can define the structured first major surface 144 and the regular array of spaced apart structures, or microlenses 142, as described above. The structured first major surface 144 can have a first surface energy. Each microlens 142 can have a maximum height H1. In some embodiments, as exemplarily shown in FIG. 7, H1 can be measured from the base B of the microlens 142 to the apex A of the microlens 142.

The optical construction 300 can further include an intermediate optical layer 304. The intermediate optical layer 304 can be disposed on, adjacent, proximate and/or in contact with the structured first major surface 144. In some embodiments, the intermediate optical layer 304 is substantially co-extensive with the structured first major surface 144. The intermediate optical layer 304 can define a structured second major surface 308. The structured second major surface 308 can be on a side of the intermediate optical layer 304 substantially opposite to another side of the intermediate optical layer 304 that is adjacent, proximate, in contact with and/or on the structured first major surface 144.

In some embodiments, acceptance of the light absorbing layer 170 on the structured first major surface 144 without the light absorbing layer 170 beading up can be defined as a "wettability" of the structured first major surface 144. Wettability can refer to the mixture of a binder, a light blocking material and a solvent (that forms the light absorbing layer 170) retaining its continuity over the structured first major surface 144 such that a continuous layer forms over the first structured major surface 144 and the microlenses 142 as the mixture dries. "Dewetting" of the mixture can cause the mixture to rupture such that holes appear in the mixture as coated on the structured first major surface 144. Wetting of the structured first major surface 144 can be accomplished if the surface tension of the mixture, when deposited on the structured first major surface 144, is lower than a surface energy of the substrate (or, of the structured first major surface 144). To obtain a desired wettability of the structured first major surface 144, a surface tension of the mixture can be substantially lower than a surface energy of the structured first major surface 144, and in various embodiments, can be, or can be about, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of the surface energy of the structured first major surface 144. Dewetting of the mixture can occur when the surface tension of the mixture is higher than the surface energy of the structured first major surface. It has been observed that when the mixture surface tension approaches the surface energy of the microlenses 142, or the structured first major surface 144, the mixture begins dewetting at the surface of the microlenses 142, leaving the microlenses 142 free of the mixture, and thus of the light absorbing layer 170, when the solvent dries from mixture.

A typical range of microlens 142 surface energies can be in the range of 30-55 dynes/cm. A typical mixture may have a surface tension in the range of 22-45 dynes/cm. In order to promote dewetting of mixtures from the microlenses 142 and/or structured first major surface 144, the surface energy of the structured first major surface 144 can be lowered relative to that of the mixture. An intermediate optical layer 304 can promote the dewetting of at least a portion of the mixture. The intermediate optical layer 304 layer can be chosen to have a surface energy sufficiently below a surface tension of the mixture. A suitable surface energy for the intermediate optical layer 304 can be as low as 20 dynes/25 cm, which would be lower than a typical mixture surface tension of 24 dynes/cm.

In some embodiments, a surface tension of the mixture can be substantially lower than a surface energy of the intermediate optical layer 304, and in various embodiments, can be, or can be about, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of the surface energy of the intermediate optical layer 304.

In some embodiments, a surface tension of the mixture can be, or can be about, 1, 2, 3, 4, 5, 10, 15, 24, 25, 30, 35, 40, 45, 50, 60, 70, 80, 90, 100, 200, 500 or 1000 dynes/cm. In some embodiments, a surface energy of the intermediate optical layer 304 can be, or can be about, 1, 2, 3, 4, 5, 10, 15, 24, 25, 30, 35, 40, 45, 50, 60, 70, 80, 90, 100, 200, 500 or 1000 dynes/cm. In some embodiments, a surface energy of the structured first major surface 144 can be, or can be about, 1, 2, 3, 4, 5, 10, 15, 24, 25, 30, 35, 40, 45, 50, 60, 70, 80, 90, 100, 200, 500 or 1000 dynes/cm.

The intermediate optical layer 304 can promote the dewetting of at least a portion of the mixture (that forms the light absorbing layer 170 as described above), including the solvent and the light absorbing material, from a region 312 of the optical construction 300 corresponding to the microlenses 142 to a region 316 of the optical construction 300 between the microlenses 142. In some embodiments, the intermediate optical layer 304 enables the dewetting of at least a portion of the mixture from the region 312 of the optical construction 300 corresponding to the microlenses 142 to the region 316 of the optical construction 300 between the microlenses 142 whereas the portion of the mixture would not dewet from the region 312 of the optical construction 300 corresponding to the microlenses 142 to the region 316 of the optical construction 300 between the microlenses 142 in the absence of the intermediate optical layer 304.

The structured second major surface 308 can have a second surface energy, and the second surface energy can be less than the first surface energy. In various embodiments, the second surface energy is about 0.001%, 0.005%, 0.01%, 0.05%, 0.1%, 0.5%, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of the first surface energy. In various embodiments, the second surface energy is less than about 0.001%, 0.005%, 0.01%, 0.05%, 0.1%, 0.5%, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of the first surface energy.

The intermediate optical layer 304 can have a maximum thickness H2. In some embodiments, H2≤H1. In some embodiments, H2<H1. In various embodiments, H2≤about 0.001%, 0.005%, 0.01%, 0.05%, 0.1%, 0.5%, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of H1. In various embodiments, H2<about 0.001%, 0.005%, 0.01%, 0.05%, 0.1%, 0.5%, 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of H1. In various embodiments, H2 is about 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90% or 95% of H1.

The light absorbing layer 170 can be disposed on, proximate, in contact with and/or adjacent the intermediate optical layer 304. In various embodiments, the light absorbing layer 170 can be disposed on, proximate, in contact with and/or adjacent the structured second major surface 308. In some embodiments, the light absorbing layer 170 is substantially co-extensive with the intermediate optical layer 304 and/or the structured second major surface 308.

The light absorbing layer 170 can be disposed at least partially between the microlenses, or structures, 142. In some embodiments, the light absorbing layer 170 can also be disposed on, adjacent, proximate and/or in contact with portions of the intermediate optical layer 304 corresponding to, or disposed on, the microlenses, or structures 142. In some embodiments, the light absorbing layer 170 is disposed discontinuously on, adjacent, contacting and/or proximate the intermediate optical layer 304. Further, in some embodiments, the light absorbing layer 170 is not disposed on, adjacent, in contact with and/or proximate at least portions of the region 316 of the optical construction 300 corresponding to the microlenses 142.

In some embodiments, an optical transmission of a particular element can be described as a percentage of light incident on the element passing therethrough. In various embodiments, an optical transmission of the optical construction 300 in regions 316 between the microlenses 142 can be less than an optical transmission of the optical construction 300 in regions 312 corresponding to the microlenses 142 by at least a factor of about 2, 5, 10, 25, 50, 100, 150, 200, 250, 500, 1,000 or 5,000. In some embodiments, an optical transmission of the optical construction 300 in regions 316 between the structures, or microlenses, 142 can be less than an optical transmission of the optical construction 300 in regions 312 corresponding to the structures by a factor of about 2, 5, 10, 25, 50, 100, 150, 200, 250, 500, 1,000 or 5,000. In some embodiments, the intermediate optical layer 304 can include silicones, polyolefins, fluorinated materials and mixtures thereof.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent embodiments can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. An optical system comprising:
an optical sensor configured to receive light and form an image;
a microlens film comprising:
a structured first major surface opposite a second major surface, the structured first major surface including a regular array of spaced apart microlenses arranged across a width and a length of the microlens film, each microlens having an effective imaging area and configured to form an image onto the optical sensor; and
a light absorbing layer disposed on and in contact with the array of spaced apart microlenses wherein the light absorbing layer is continuous on the structured first major surface and over the microlenses; and
a display panel, the optical sensor, and the microlens film being substantially co-extensive with each other along the width and length of the microlens film, such that when an object having a first spatial frequency of about 4 line pairs per mm is placed about 1.5 mm from the microlens film, each microlens is configured to form an image of the object on the optical sensor, the image having a modulation transfer function (MTF) of greater than about 0.2 at the first spatial frequency.

2. The optical system of claim 1, wherein when all but a first one of the microlenses are covered by the light absorbing layer so that only the first microlens forms an image of the object on the optical sensor, the modulation transfer function (MTF) of the image formed by the first microlens onto the optical sensor increases by less than about 10%.

3. The optical system of claim 1, wherein the microlens film includes polyethylene terephthalate.

4. The optical system of claim 1, wherein the object has a first angular frequency of about 6 cycles per radian, wherein when the object is placed in front of the microlens film, each microlens forming an image of the object on the optical sensor having a modulation transfer function (MTF) of greater than about 0.2 at the first angular frequency.

* * * * *